United States Patent
Capecchi et al.

(10) Patent No.: US 11,615,820 B1
(45) Date of Patent: Mar. 28, 2023

(54) REGULATOR OF A SENSE AMPLIFIER

(71) Applicants: STMicroelectronics S.r.l., Agrate Brianza (IT); STMicroelectronics International N.V., Geneva (CH)

(72) Inventors: Laura Capecchi, Vedano al Lambro (IT); Marcella Carissimi, Treviolo (IT); Marco Pasotti, Travaco' Siccomario (IT); Vikas Rana, Noida (IN); Vivek Tyagi, Ghaziabad (IN)

(73) Assignees: STMicroelectronics S.r.l., Agrate Brianza (IT); STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/490,976

(22) Filed: Sep. 30, 2021

(51) Int. Cl.
  *G11C 7/06* (2006.01)
  *G11C 7/14* (2006.01)

(52) U.S. Cl.
  CPC .............. *G11C 7/062* (2013.01); *G11C 7/14* (2013.01); *G11C 2207/063* (2013.01)

(58) Field of Classification Search
  CPC ............ G11C 7/062; G11C 7/14; G11C 7/063
  See application file for complete search history.

(56) References Cited

U.S. PATENT DOCUMENTS

| | | | | |
|---|---|---|---|---|
| 7,126,839 | B2* | 10/2006 | Kang | G11C 11/22 365/189.04 |
| 10,482,959 | B2* | 11/2019 | Lee | G06F 13/4063 |
| 2003/0132872 | A1 | 7/2003 | Casper et al. | |
| 2007/0041236 | A1* | 2/2007 | Raszka | G11C 16/0441 365/149 |
| 2008/0298122 | A1 | 12/2008 | Bedeschi et al. | |
| 2009/0091969 | A1 | 4/2009 | Ueda | |
| 2013/0229863 | A1 | 9/2013 | Conte et al. | |
| 2014/0177319 | A1 | 6/2014 | Park | |
| 2017/0365336 | A1 | 12/2017 | Lin et al. | |
| 2018/0068721 | A1 | 3/2018 | Calvetti et al. | |
| 2021/0020237 | A1 | 1/2021 | Carissimi et al. | |
| 2021/0035637 | A1 | 2/2021 | Capecchi et al. | |

FOREIGN PATENT DOCUMENTS

WO    2018155405 A1    8/2018

OTHER PUBLICATIONS

Satterfield, Garrett, "Programmable low-side current sink circuit," Texas Instruments, Analog Engineer's Circuit: Data Converters, SLAA868, Dec. 2018, 6 pages.

* cited by examiner

*Primary Examiner* — Connie C Yoha
(74) *Attorney, Agent, or Firm* — Slater Matsil, LLP (57) ABSTRACT

A system and method for operating a memory cell is provided. A non-volatile memory storage device includes an array of memory cells of differential or single-ended type. In an embodiment, a regulator is coupled to a sense amplifier. The regulator is configured to generate a voltage to gate terminals of one or two transistors of the sense amplifier. In the differential type, the voltage is generated such that the first bias current and the second bias current have a current value equal to the sum of a maximum current flowing in a memory cell being in a RESET state and a fixed current. In the single-ended type, the regulated voltage is generated such that the first bias current and the second bias current have a current value equal to the sum of a fixed current and the reference current generated by the reference current source across temperature.

20 Claims, 6 Drawing Sheets

REGULATOR OF A SENSE AMPLIFIER

TECHNICAL FIELD

The present disclosure generally relates to non-volatile memory and, in particular embodiments, to a regulator of a sense amplifier used in non-volatile memory.

BACKGROUND

A variety of non-volatile memories are available today, such as phase-change memories (PCMs), where the characteristics of materials having the property of switching between phases with a different electrical behavior are exploited for storing information. These materials can switch between a disorderly or amorphous phase and an orderly crystalline or polycrystalline phase.

Different phases are characterized by different resistivity values and are associated with different stored datum values. The elements of Groups XV and XVI of the periodic table, such as tellurium (Te), selenium (Se), and antimony (Sb), also known as pnictogens and chalcogens, can be used for manufacturing phase-change memory cells. In particular, an alloy formed by germanium (Ge), antimony (Sb), and tellurium (Te), known as GST (having the chemical composition Ge2Sb2Te5), is currently widely used in such memory cells.

The phase changes can be obtained by locally increasing the temperature of the cells of chalcogen materials through resistive electrodes (i.e., heaters) set in contact with corresponding regions of the chalcogen material.

Access or selection devices (for example, bipolar or metal oxide semiconductor transistors) are connected to the resistive electrodes and selectively enable the passage of a programming electric current (i.e., write electric current) through them. By the Joule effect, the electric current generates the temperature required for phase change to switch from a high-resistivity state (i.e., RESET state) to a low-resistivity state (i.e., SET state) or vice versa.

During a read operation, the state of the chalcogen material is detected by applying a low voltage and then reading the value of the current that flows in the memory cell through a sense amplifier. Given that the current is proportional to the conductivity of the chalcogen material, it is possible to determine the state of the material and consequently the datum stored in the memory cell.

SUMMARY

A first aspect relates to a non-volatile memory storage device, which includes an array of memory cells of a differential type, a sense amplifier, and a regulator. The array of memory cells includes a plurality of pair of memory cells, and each pair of memory cells includes a first memory cell and a second memory cell. The first memory cell is in one of a SET state or a RESET state and the second memory cell is in a state other than that of the first memory cell. The sense amplifier includes a first branch coupled to a first memory cell and a second branch coupled to a second memory cell. The sense amplifier is configured to generate a first bias current in the first branch by a first transistor of the sense amplifier, generate a second bias current in the second branch by a second transistor of the sense amplifier—the first bias current being the same as the second bias current. The sense amplifier is further configured to sense a first delta current corresponding to a difference between the first bias current and a current flowing in the first memory cell, and sense a second delta current corresponding to a difference between the second bias current and a current flowing in the second memory cell. The regulator is coupled to the sense amplifier and is configured to generate a regulated voltage to gate terminals of the first transistor and the second transistor of the sense amplifier. The regulated voltage generated is such that the first bias current and the second bias current have a current value equal to the sum of a maximum current flowing in a memory cell being in a RESET state and a fixed current.

In a first implementation form of the non-volatile memory storage according to the first aspect as such, a value of the fixed current is between 5 and 80 microamps.

In a second implementation form of the non-volatile memory storage device according to the first aspect as such or any preceding implementation form of the first aspect, the source terminals of the first transistor and the second transistor are coupled to a supply voltage having a voltage of approximately 1 Volts.

In a third implementation form of the non-volatile memory storage device according to the first aspect as such or any preceding implementation form of the first aspect, the regulator includes an operational amplifier (op-amp) having a non-inverting input coupled to a drain terminal of the first transistor and an inverting input coupled to a reference voltage.

In a fourth implementation form of the non-volatile memory storage device according to the first aspect as such or any preceding implementation form of the first aspect, the first memory cell is in a SET state and the second memory cell is in the RESET state, and the current flowing in the first memory cell is greater than the current flowing in the second memory cell.

In a fifth implementation form of the non-volatile memory storage device according to the first aspect as such or any preceding implementation form of the first aspect, the first memory cell is in a SET state and the second memory cell is in the RESET state, and the second memory cell is a lesser conductive memory cell than the first memory cell.

In a sixth implementation form of the non-volatile memory storage device according to the first aspect as such or any preceding implementation form of the first aspect, the non-volatile memory storage device further includes a memory used to store a list of reference voltage values corresponding to each particular pair of memory cells of the array of memory cells, and the regulated voltage is generated such that the current value being equal to the sum of the maximum current flowing in the memory cell being in the RESET state is particular to each memory cell pairing of the array of memory cells.

A second aspect relates to a non-volatile memory storage device, which includes an array of memory cells of a single-ended type, a sense amplifier, and a regulator. Each memory cell is in one of a SET state or a RESET state. The sense amplifier includes a first branch coupled to a memory cell and a second branch coupled to a reference current source. The sense amplifier is configured to generate a first bias current in the first branch by a first transistor of the sense amplifier, generate a second bias current in the second branch by a second transistor of the sense amplifier—the first bias current is the same as the second bias current. The sense amplifier is further configured to sense a first delta current corresponding to a difference between the first bias current and a current flowing in the memory cell, and sense a second delta current corresponding to a difference between the second bias current and a reference current generated by the reference current source. The regulator is coupled to the sense amplifier and is configured to generate a regulated voltage to gate terminals of the first transistor and the second transistor of the sense amplifier. The regulated voltage is generated such that the first bias current and the second bias current have a current value equal to the sum of a fixed current and the reference current generated by the reference current source across temperature.

In a first implementation form of the non-volatile memory storage according to the second aspect as such, a value of the fixed current is between 5 and 80 microamps.

In a second implementation form of the non-volatile memory storage device according to the second aspect as such or any preceding implementation form of the second aspect, the source terminals of the first transistor and the second transistor are coupled to a supply voltage having a voltage of approximately 1 Volts.

In a third implementation form of the non-volatile memory storage device according to the second aspect as such or any preceding implementation form of the second aspect, the regulator includes an operational amplifier (op-amp) having a non-inverting input and an inverting input. The non-inverting input is coupled to a drain terminal of the first transistor and the reference current source, and the inverting input is coupled to a reference voltage.

In a fourth implementation form of the non-volatile memory storage device according to the second aspect as such or any preceding implementation form of the second aspect, the reference current generated by the reference current is adjusted based on a temperature reading of the non-volatile memory storage device.

In a fifth implementation form of the non-volatile memory storage device according to the second aspect as such or any preceding implementation form of the second aspect, the regulator includes an operational amplifier (op-amp) having a non-inverting input coupled to a drain terminal of the first transistor. The non-inverting input is coupled in a shunt configuration with the reference current source.

In a sixth implementation form of the non-volatile memory storage device according to the second aspect as such or any preceding implementation form of the second aspect, the reference current source includes a multiplexer and a configurable current sink. The multiplexer is configured to adjust the configurable current sink based on a sensed temperature of the non-volatile memory storage device.

A third aspect relates to a device, which includes an array of memory cells of a single-ended type, a sense amplifier, a regulator, and a controller. Each memory cell is in one of a SET state or a RESET state. The sense amplifier includes a first branch coupled to a memory cell and a second branch coupled to a reference current source. The sense amplifier is configured to generate a first bias current in the first branch by a first transistor of the sense amplifier, generate a second bias current in the second branch by a second transistor of the sense amplifier—the first bias current being the same as the second bias current. The sense amplifier is further configured to sense first delta current corresponding to a difference between the first bias current and a current flowing in the memory cell, and sense a second delta current corresponding to a difference between the second bias current and a reference current generated by the reference current source. The regulator is coupled to the sense amplifier and is configured to generate a regulated voltage to gate terminals of the first transistor and the second transistor of the sense amplifier. The regulated voltage is generated such that the first bias current and the second bias current have a current value equal to the sum of a fixed current and the reference current generated by the reference current across temperatures. The controller is coupled to the regulator, sense amplifier, and the array of memory cells. The controller is configured to generate a control signal to the regulator to generate the regulated voltage.

In a first implementation form of the device according to the third aspect as such, a value of the fixed current is between 5 and 80 microamps.

In a second implementation form of the device according to the third aspect as such or any preceding implementation form of the third aspect, the source terminals of the first transistor and the second transistor are coupled to a supply voltage having a voltage of approximately 1 Volts.

In a third implementation form of the device according to the third aspect as such or any preceding implementation form of the third aspect, the regulator includes an operational amplifier (op-amp) having a non-inverting input coupled to a drain terminal of the first transistor. The non-inverting input further coupled in a shunt configuration with the reference current source.

In a fourth implementation form of the device according to the third aspect as such or any preceding implementation form of the third aspect, the reference current source includes a multiplexer and a configurable current sink. The multiplexer is configured to adjust the configurable current sink based on a sensed temperature of the array of memory cells.

In a fifth implementation form of the device according to the third aspect as such or any preceding implementation form of the third aspect, the reference current generated by the reference current source is adjusted based on a temperature reading of the array of memory cells.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

While inventive aspects are described primarily in the context of a phase-change memory type, the inventive aspects may be similarly applicable to other types of memory such as FLASH, PCM with a bipolar junction transistor (BJT), magnetoresistive RAM (MRAM), resistive random access memory (RRAM), or the like.

Embodiments provide a sense amplifier and a method for operating for accessing a memory device. In an embodiment, a non-volatile memory storage device includes an array of memory cells of a differential type. In such an embodiment, the array of memory cells includes a plurality of pair of memory cells, one or more sense amplifiers, and a regulator.

Each pair of memory cells includes a first memory cell and a second memory cell. The first memory cell is in one of a SET state or a RESET state and the second memory cell is in a state other than that of the first memory cell. The array of memory cells includes one or more sense amplifiers.

Each sense amplifier includes a first branch coupled to a first memory cell and a second branch coupled to a second memory cell. The sense amplifier is configured to generate a first bias current in the first branch by a first transistor of the sense amplifier, generate a second bias current in the second branch by a second transistor of the sense amplifier, where the first bias current is the same as the second bias current. The sense amplifier is further configured to sense a first delta current corresponding to a difference between the first bias current and a current flowing in the first memory cell, and sense a second delta current corresponding to a difference between the second bias current and a current flowing in the second memory cell.

The regulator is coupled to the sense amplifier and is configured to generate a regulated voltage to gate terminals of the first transistor and the second transistor of the sense amplifier. The regulated voltage is generated such that the first bias current and the second bias current have a current value equal to the sum of a maximum current flowing in a memory cell being in a RESET state and a fixed current.

In another embodiment, a non-volatile memory storage device includes an array of memory cells of a single-ended type. In such an embodiment, the array of memory cells includes a plurality of pair of memory cells, one or more sense amplifiers, and a regulator. Each memory cell is in one of a SET state or a RESET state.

Each sense amplifier includes a first branch coupled to a memory cell and a second branch coupled to a reference current source. The sense amplifier is configured to generate a first bias current in the first branch by a first transistor of the sense amplifier, generate a second bias current in the second branch by a second transistor of the sense amplifier, where the first bias current is the same as the second bias current. The sense amplifier is further configured to sense a first delta current corresponding to a difference between the first bias current and a current flowing in the memory cell, and sense a second delta current corresponding to a difference between the second bias current and a reference current generated by the reference current source.

The regulator is coupled to the sense amplifier and is configured to generate a regulated voltage to gate terminals of the first transistor and the second transistor of the sense amplifier. The regulated voltage is generated such that the first bias current and the second bias current have a current value equal to the sum of a fixed current and the reference current generated by the reference current source across temperature. These and other details are discussed in greater detail below.

Figure 1:
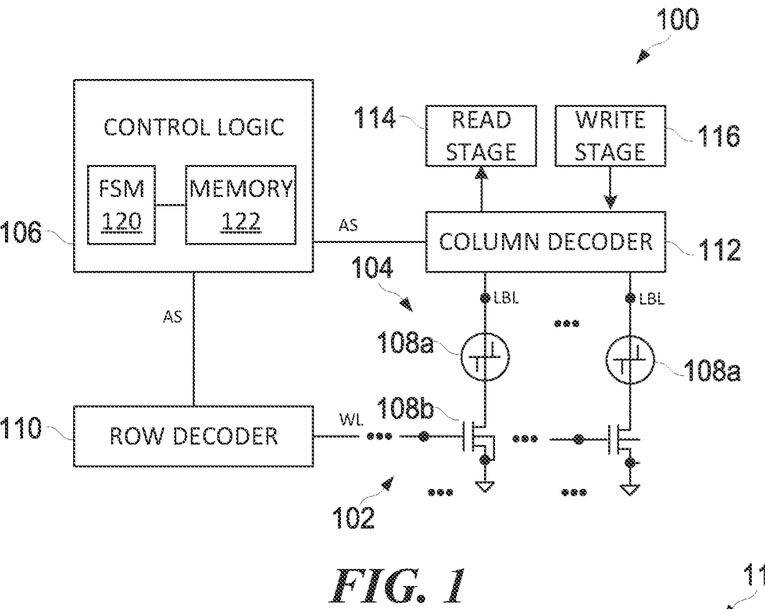
FIG. 1 is a non-volatile memory storage device.

FIG. 1 illustrates a non-volatile memory storage device 100. The non-volatile memory storage device 100 includes a memory array 102 formed by memory cells 104. The memory cells 104 are arranged in rows (i.e., wordlines (WL)) and columns (i.e., bit lines (BL)/local bit lines (LBL). Each memory cell 104 includes a storage element 108a and an access element 108b. The storage element 108a and the access element 108b are arranged in series between a respective local bit line (LBL) and a ground terminal. A wordline (WL) is defined by the set of all control terminals of the access elements 108b that are aligned within the same (i.e., identical) row.

The access element 108b is an N-channel metal oxide semiconductor (MOS) transistor. The gate terminal, drain terminal, and source terminal of the access element 108b are, respectively, coupled to a respective wordline (WL), the first terminal of the storage element 108a, and the ground terminal. The second terminal of the storage element 108a is coupled to a respective local bit line (LBL). The access element 108b is controlled and biased to enable when selected, the passage of a read current or a write current through the storage element 108a.

The non-volatile memory storage device 100 includes a control logic 106, a column decoder 112, and a row decoder 110. The column decoder 112 and the row decoder 110 enable the selection of the memory cells 104 based on address signals (AS) received from the control logic 106. The control logic 106 may include a finite state machine (FSM) circuit 120 to control various operations disclosed herein. The control logic 106 may additionally include an on-board memory 122 to store instructions or configurations for the operation of the control logic 106.

In particular, the control logic 106 enables reading and writing of the memory cells 104 through the address signals (AS). The row decoder 110 and the column decoder 112 enable bias of a memory cell of the memory cells 104 at appropriate voltage values based on a selected wordline (WL) and local bit line (LBL) designated by the address signals (AS). Further, the control logic 106 communicates control signals to the row decoder 110 and the column decoder 112 to control the read and write operations of the memory cells 104.

The column decoder 112 operates in a read mode and a write mode. In the read mode, a read path provides a conductive path between a selected local bit line (LBL) and the read stage circuit 114.

In the write mode, a write path provides a conductive path between a selected local bit line (LBL) and the write stage circuit 116. The write stage circuit 116 is configured to supply currents required for write operations (i.e., programming of the memory cells 104 in corresponding logic stages) and storage of information.

Thus, the column decoder 112 includes selection elements (e.g., controlled transistors) for the read and write paths, which are connected to implement an address-decoding system—typically hierarchical—for the selection of the memory cells 104.

Typically, the memory array 102 is organized in a plurality of sectors, each of which includes multiple memory cells 104. Each sector is associated with a corresponding portion of the row decoder 110 where the respective wordlines (WL) arrive. Moreover, each sector includes a plurality of respective wordlines (WL) and respective local bit lines (LBL)—distinct from those of other sectors, which are physically connected to the memory cell 104 of the sector. For each set of a number K of local bit lines (LBL), two main bit lines (MBL) are provided: one for reading and one for writing. However, the read and write do not require different main bit lines (MBL).

The local bit lines (LBL) of each sector are specific for that sector (i.e., not shared between different sectors). Instead, the main bit lines (MBL) can be shared between two or more sectors (i.e., electrically coupled to local bit lines (LBL) of both of the sectors, provided that this does not coincide).

Figure 2:
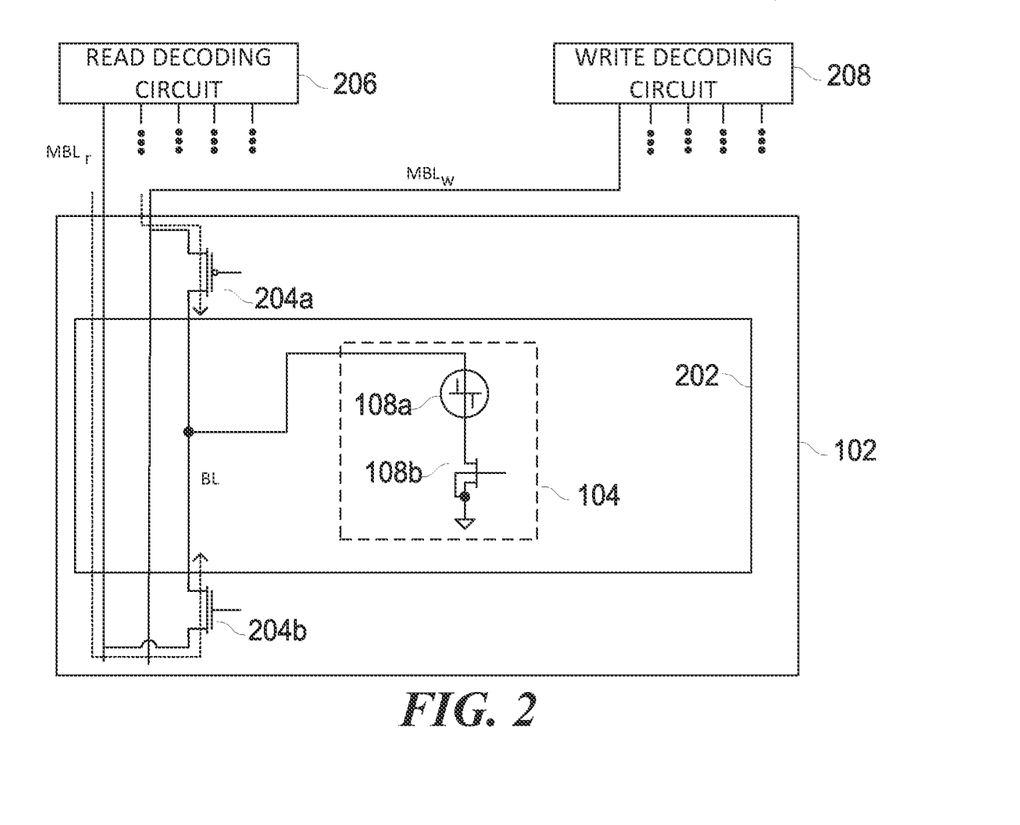
FIG. 2 is a column decoder, as may be arranged in the non-volatile memory storage of FIG. 1.

FIG. 2 illustrates a column decoder 112, as may be arranged in the non-volatile memory storage device 100. As shown, each local bit line (LBL) of memory cell 104 is connected to a respective main read bit line ($MBL_r$) and a respective main write bit line ($MBL_w$) via, respectively, a switch 204b and a switch 204a. The switch 204a is a metal oxide semiconductor transistor of the P-type, and the switch 204b is a metal oxide semiconductor transistor of the N-type.

The switch 204a and the switch 204b implement the first level of a hierarchical decoding system implemented by the column decoder 112. The column decoder 112 includes a read decoding circuit 206 and a write decoding circuit 208, which implement a second level of the hierarchical decoding system. The read decoding circuit 206 is coupled to the main read bit lines ($MBL_r$), and the write decoding circuit 208 is coupled to the main write bit lines ($MBL_w$). The read decoding circuit 206 can be controlled to selectively couple the main read bit lines ($MBL_r$) to the read stage circuit 114, and the write decoding circuit 208 can be controlled to selectively couple the main write bit lines ($MBL_w$) to the write stage circuit 116.

In the read mode, a plurality of the switch 204a are controlled by sets of first-level bias signals, denoted by YO<1:K>, where K is the number of local bit lines associated with a single main read bit line ($MBL_r$). The first-level bias signals YO<1:K> control the connections between the local bit lines (LBL) and the corresponding main read bit lines ($MBL_r$). Moreover, the connections between the main read bit lines ($MBL_r$) and the read stage circuit 114 are controlled by second-level bias signals, designated by YM. In embodiments, signals YO and YM regulate the bit line to a desired voltage value.

The read decoding circuit 206, the main read bit line ($MBL_r$), and the switch 204b form a read path that connects the memory cell 104 to the read stage circuit 114 for a selected local bit line (LBL) and a memory cell 104 (i.e., the memory cell 104 electrically coupled to the selected local bit line (LBL) and the selected wordline (WL)).

The column decoder 112 includes, for each sector 202, at least a respective first-level decoding circuit for the read operations and write operations, which is coupled to the respective local bit lines (LBL) and can be activated for selecting the local bit lines (LBL).

The column decoder 112 further includes, for each set of sectors 202, a respective second-level decoding circuit for the read operations and write operations, which is coupled to the respective main bit lines (MBL) and can be activated for selecting the latter. Each first-level decoding circuit includes a respective first-level subcircuit for read operations and a respective first-level subcircuit for write operations. Each second-level decoding circuit includes a respective second-level subcircuit for read operations and a respective second-level subcircuit for the write operations. For example, the first-level subcircuits for read operations and the first-level subcircuits for write operations include, respectively, the switch 204b and the switch 204a. The second-level subcircuits for read operations and the second-level subcircuits for write operations form, respectively, the read decoding circuit 206 and the write decoding circuit 208.

In the K local bit lines (LBL) of a sector 202, the first-level subcircuit for the read operations coupled to sector 202 can be controlled electrically, by the first-level bias signals YO<1:K>, to electrically couple, each time, one of the K local bit lines (LBL)—in particular, the local bit line selected—to the corresponding main read bit line ($MBL_r$).

The second-level subcircuit for read operations can be controlled electrically by the second-level bias signals YM, to electrically couple the main read bit line ($MBL_r$) to the read stage circuit 114—coupling to the read stage circuit 114 enables bias of the selected main read bit line ($MBL_r$) and local bit line (LBL). Similar considerations apply to the first-level subcircuit for write operations coupled to sector 202, which couples the main write bit line ($MBL_w$) selected to the write stage circuit 116, also known as "program load."

The non-volatile memory storage device 100 may be of the single-ended type, in which case the read stage circuit 114 is configured to compare the current that circulates in the memory cell 104 with a reference current to determine the stored data.

Alternatively, the non-volatile memory storage device 100 may be of the differential type, in which case data is programmed in pairs of memory cells 104 so that the cells of each pair store opposite data, and the read stage circuit 114 is configured to compare the currents that circulate in the memory cells 104 of the selected pair.

Regardless of whether the non-volatile memory storage device 100 is of a single-ended type or a differential type, the read stage circuit 114 includes a plurality of sense amplifiers. Each sense amplifier includes a first input and a second input. During the read operation, the first input of a sense amplifier is connected, in a way controlled by the column decoder 112, to a first selected memory cell 104a, and the second input is connected to a second selected memory cell 104b—in the case of differential reading—or to a reference-current generator—in the case of single-ended reading.

The sense amplifier generates an output that depends upon the comparison between the current that flows in the first selected memory cell 104a and the current that flows in the second selected memory cell 104b—in the case of differential reading—or in the reference-current generator—in the case of single-ended reading.

The sense amplifiers are connected to a supply voltage $V_{dd}$, which may be rather low, for example, approximately equal to 1 Volt. Since the local bit lines (LBL) are biased at a voltage typically approximately equal to 0.6 Volts when selected, the sense amplifiers have an extremely small voltage margin available. A system and method that improves the operation of the sense amplifier given environmental conditions of the memory cell are, thus, desirable.

Figure 3:
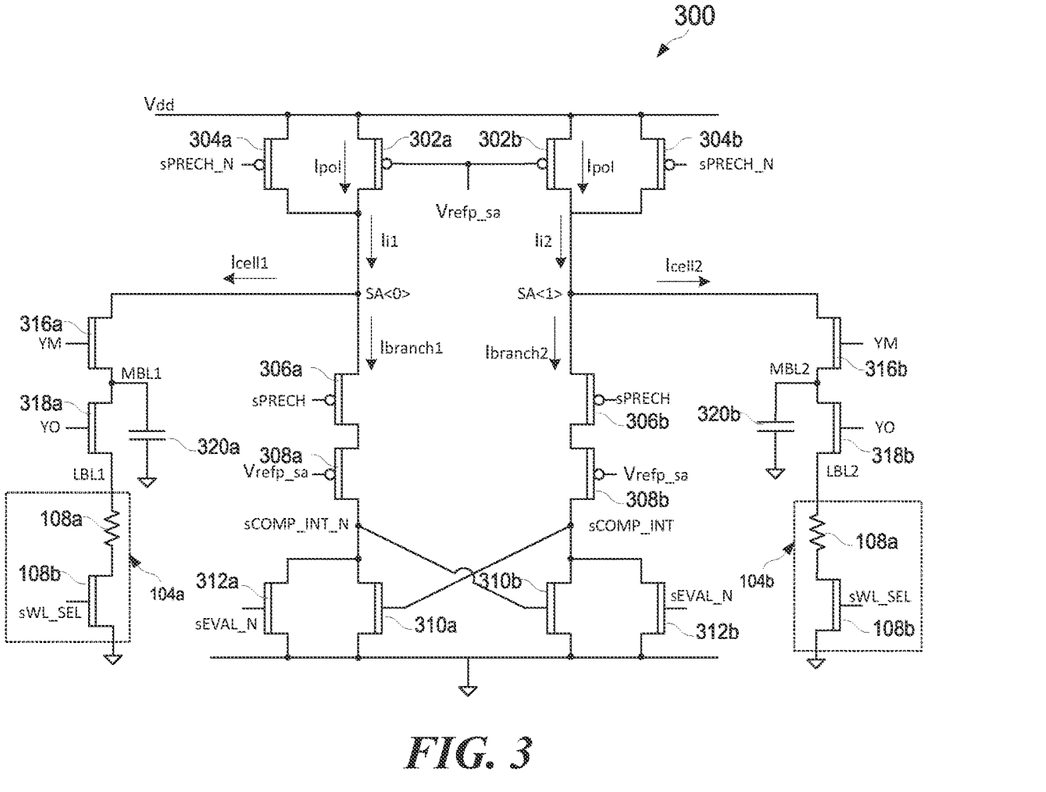
FIG. 3 is an embodiment sense amplifier for reading differential-type memory cells.

FIG. 3 illustrates an embodiment sense amplifier 300 for reading differential-type memory cells, as may be implemented in the non-volatile memory storage device 100.

Sense amplifier 300 includes a first bias transistor 302a, a second bias transistor 302b, a first pre-charge transistor 304a, and a second pre-charge transistor 304b. In embodiments, the first bias transistor 302a, the second bias transistor 302b, the first pre-charge transistor 304a, and the second pre-charge transistor 304b are of a P-channel enhancement-mode transistor type. In embodiments, the first bias transistor 302a, the second bias transistor 302b, the first pre-charge transistor 304a, and the second pre-charge transistor 304b are of the same type.

The source terminals of the first bias transistor 302a, the second bias transistor 302b, the first pre-charge transistor 304a, and the second pre-charge transistor 304b are electrically coupled to a supply voltage $V_{dd}$. In embodiments, the voltage value of the supply voltage $V_{dd}$ is equal to 1V. The gate terminals of the first bias transistor 302a and the second bias transistor 302b are electrically coupled to a reference voltage $V_{refp\_sa}$. A signal sPRECH_N is present at the gate terminals of the first pre-charge transistor 304a and the second pre-charge transistor 304b. The drain terminals of the first bias transistor 302a and the first pre-charge transistor 304a are electrically coupled to each other, indicated by first input node SA<0>. Similarly, the drain terminals of the second bias transistor 302b and the second pre-charge transistor 304b are electrically coupled to each other, indicated by second input node SA<1>.

In embodiments, the first pre-charge transistor 304a, and the second pre-charge transistor 304b can be absent, in which case the precharging stage (described further below) is carried out on the basis of just the currents delivered by the first bias transistor 302a and the second bias transistor 302b.

The sense amplifier 300 further includes a first upper control transistor 306a, second upper control transistor 306b, a first lower control transistor 308a, and a second lower control transistor 308b. In embodiments, the first upper control transistor 306a, the second upper control transistor 306b, the first lower control transistor 308a, and the second lower control transistor 308b are of a P-channel enhancement-mode transistor type. In embodiments, the first upper control transistor 306a, the second upper control transistor 306b, the first lower control transistor 308a, and the second lower control transistor 308b are of the same type.

The source terminal of the first upper control transistor 306a is electrically coupled to the drain terminals of the first bias transistor 302a and the first pre-charge transistor 304a. The first upper control transistor 306a and the first lower control transistor 308a are electrically coupled in series. In particular, the drain terminal of the first upper control transistor 306a is electrically coupled to the source terminal of the first lower control transistor 308a.

The source terminal of the second upper control transistor 306b is electrically coupled to the drain terminals of the second bias transistor 302b and the second pre-charge transistor 304b. The second upper control transistor 306b and the second lower control transistor 308b are electrically coupled in series. In particular, the drain terminal of the second upper control transistor 306b is electrically coupled to the source terminal of the second lower control transistor 308b.

A signal sPRECH is present at the gate terminals of the first upper control transistor 306a and the second upper control transistor 306b. The singal sPRECH is equal to a logical negation of the signal sPRECH_N. In embodiments, the signals sPRECH and sPRECH_N are generated by the control logic 106. The value of the signals sPRECH and sPRECH_N vary between 0 V and the supply voltage Vdd (e.g., 1 V).

The gate terminals of the first lower control transistor 308a and the second lower control transistor 308b are electrically coupled to the reference voltage $V_{refp\_sa}$. However, in embodiments, the gate terminals of the first lower control transistor 308a and the second lower control transistor 308b can be set at a controlled voltage (i.e., a voltage generated starting from a voltage reference (for example, a bandgap circuit)), which is different from the reference voltage $V_{refp\_sa}$.

In embodiments, the first upper control transistor 306a and the first lower control transistor 308a can have positions reversed with respect to one another. Likewise, the second upper control transistor 306b and the second lower control transistor 308b can have positions reversed with respect to one another.

In embodiments, the first upper control transistor 306a and the second upper control transistor 306b may be absent. In such an embodiment, the gate terminal of the first lower control transistor 308a and the second lower control transistor 308b is set at the supply voltage $V_{dd}$, in the periods of time during which the signal sPRECH is at '1,' and is set at the reference voltage $V_{refp\_sa}$ (or at another controlled voltage) in the periods of time during which the signal sPRECH is at '0.'

The sense amplifier 300 further includes a first sense transistor 310a, a second sense transistor 310b, a first verify transistor 312a, and a second verify transistor 312b. In embodiments, the first sense transistor 310a, the second sense transistor 310b, the first verify transistor 312a, and the second verify transistor 312b are of an N-channel enhancement-mode transistor type. In embodiments, the first sense transistor 310a, the second sense transistor 310b, the first verify transistor 312a, and the second verify transistor 312b are of the same type. In such embodiments, the source terminals of the first sense transistor 310a, the second sense transistor 310b, the first verify transistor 312a, and the second verify transistor 312b is electrically coupled to ground.

The drain terminals of the first sense transistor 310a and the first verify transistor 312a are electrically coupled to the drain terminal of the first lower control transistor 308a and the gate terminal of the second sense transistor 310b, having a voltage referred to as the signal sCOMP_INT_N.

The drain terminals of the second sense transistor 310b and the second verify transistor 312b are electrically coupled to the drain terminal of the second lower control transistor 308b and the gate terminal of the first sense transistor 310a, having a voltage referred to as the signal sCOMP_INT. Signals sCOMP_INT_N and sCOMP_INT are logical negations of each other.

Thus, the first sense transistor 310a and the second sense transistor 310b are electrically coupled in a cross-coupled arrangement. Signal sEVAL_N is present on the gate terminals of the first verify transistor 312 and the second verify transistor 312b. In embodiments, the signal sEVAL_N is generated by the control logic 106. The value of the signal sEVAL_N varies between 0 V and the supply voltage Vdd.

The sense amplifier 300 further includes a first first-level transistor 318a, a first second-level transistor 316a, a second first-level transistor 318b, and a second second-level transistor 316b. In embodiments, the first first-level transistor 318a, first second-level transistor 316a, second first-level transistor 318b, and second second-level transistor 316b are of an N-channel enhancement-mode transistor type. In embodiments, the first first-level transistor 318a, first second-level transistor 316a, second first-level transistor 318b, and second second-level transistor 316b are of the same type.

The first first-level transistor 318a and first second-level transistor 316a are arranged in series. The drain terminal of the first second-level transistor 316a is electrically coupled to the first input node SA<0>. The source terminal of the first second-level transistor 316a is electrically coupled to the drain terminal of the first first-level transistor 318a, which is electrically coupled with a first main bit line (MBL1) of the non-volatile memory storage device 100. The source terminal of the first first-level transistor 318a is electrically coupled to a first local bit line (LBL1) of the non-volatile memory storage device 100 and a terminal of the storage element 108a of a first memory cell 104a.

The second first-level transistor 318b and second second-level transistor 316b are arranged in series. The drain terminal of the second second-level transistor 316b is electrically coupled to the second input node SA<1>. The source terminal of the second second-level transistor 316b is electrically coupled to the drain terminal of the second first-level transistor 318b, which is electrically coupled with a second main bit line (MBL2) of the non-volatile memory storage device 100. The source terminal of the second first-level transistor 318b is electrically coupled to a second local bit line (LBL2) of the non-volatile memory storage device 100 and a terminal of the access element 108b of a second memory cell 104b.

The first memory cell 104a and the second memory cell 104b are a pair of differential-type memory cells of the non-volatile memory storage device 100.

The signal YO, generated by column decoder 112, is present at the gate terminals of the first first-level transistor 318a and the second first-level transistor 318b. The signal YM, also generated by column decoder 112, is present at the gate terminals of the first second-level transistor 316a and the second second-level transistor 316b.

The first upper control transistor 306a, the first lower control transistor 308a, the first sense transistor 310a, and the first verify transistor 312a form a first branch of the sense amplifier 300.

The second upper control transistor 306b, the second lower control transistor 308b, the second sense transistor 310b, and the second verify transistor 312b form a second branch of the sense amplifier 300.

Figure 4:
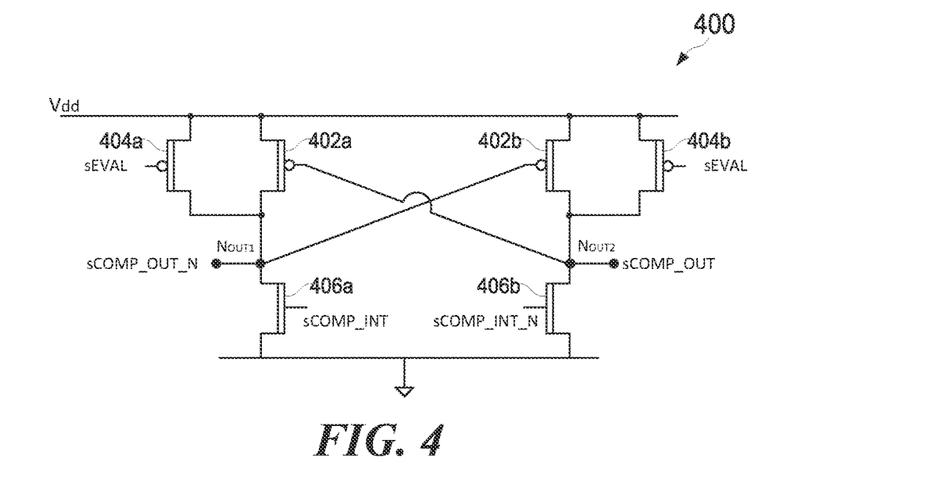
FIG. 4 is an embodiment intermediate circuit of the sense amplifier of FIG. 3.

FIG. 4 illustrates an embodiment intermediate circuit 400 of the sense amplifier 300. The intermediate circuit 400 includes a first cross-coupled transistor 402a, a second cross-coupled transistor 402b, a first enable transistor 404a, and a second enable transistor 404b. In embodiments, the first cross-coupled transistor 402a, second cross-coupled transistor 402b, first enable transistor 404a, and second enable transistor 404b are P-channel enhancement-mode type transistors. In embodiments, the first cross-coupled transistor 402a, second cross-coupled transistor 402b, first enable transistor 404a, and second enable transistor 404b are the same as one another.

The source terminals of the first cross-coupled transistor 402a, second cross-coupled transistor 402b, first enable transistor 404a, and second enable transistor 404b are electrically coupled to the supply voltage Va. The gate terminals of the first cross-coupled transistor 402a and second cross-coupled transistor 402b are connected, respectively, to the drain terminal of the second cross-coupled transistor 402b and the drain terminal of the first cross-coupled transistor 402a.

The source terminals of the first enable transistor 404a and the second enable transistor 404b are connected to the supply voltage Va. The drain terminals of the first enable transistor 404a and the second enable transistor 404b are electrically coupled, respectively, to the drain terminals of the first cross-coupled transistor 402a and the second cross-coupled transistor 402b. A signal sEVAL, equal to the logical negation of the signal sEVAL_N is present on the gate terminals of the first enable transistor 404a and the second enable transistor 404b.

Moreover, the intermediate circuit 400 includes a first output transistor 406a and a second output transistor 406b. In embodiments, the first output transistor 406a and second output transistor 406b are N-channel enhancement-mode type transistors and are, for example, the same as one another.

The source terminals of the first output transistor 406a and the second output transistor 406b are electrically coupled to ground. The drain terminal of the first output transistor 406a and the second output transistor 406b are electrically coupled, respectively, to the first output node $N_{out1}$ and the second output node $N_{OUT2}$. The voltage present at each of the first output node $N_{out1}$ and second output node $N_{out2}$ are referred to, respectively, as the signal sCOMP_OUT_N and the signal sCOMP_OUT.

The gate terminal of the first output transistor 406a is electrically coupled to the drain of the second lower control transistor 308b so as to receive the signal sCOMP_INT. The gate terminal of the second output transistor 406b is electrically coupled to the drain of the first lower control transistor 308a and receives the signal sCOMP_INT_N.

The pairs of logic values (sCOMP_INT, sCOMP_INT_N) and (sCOMP_OUT, sCOMP_OUT_N) are referred to, respectively, as the input state and the output state of the intermediate circuit 400.

Figure 5:
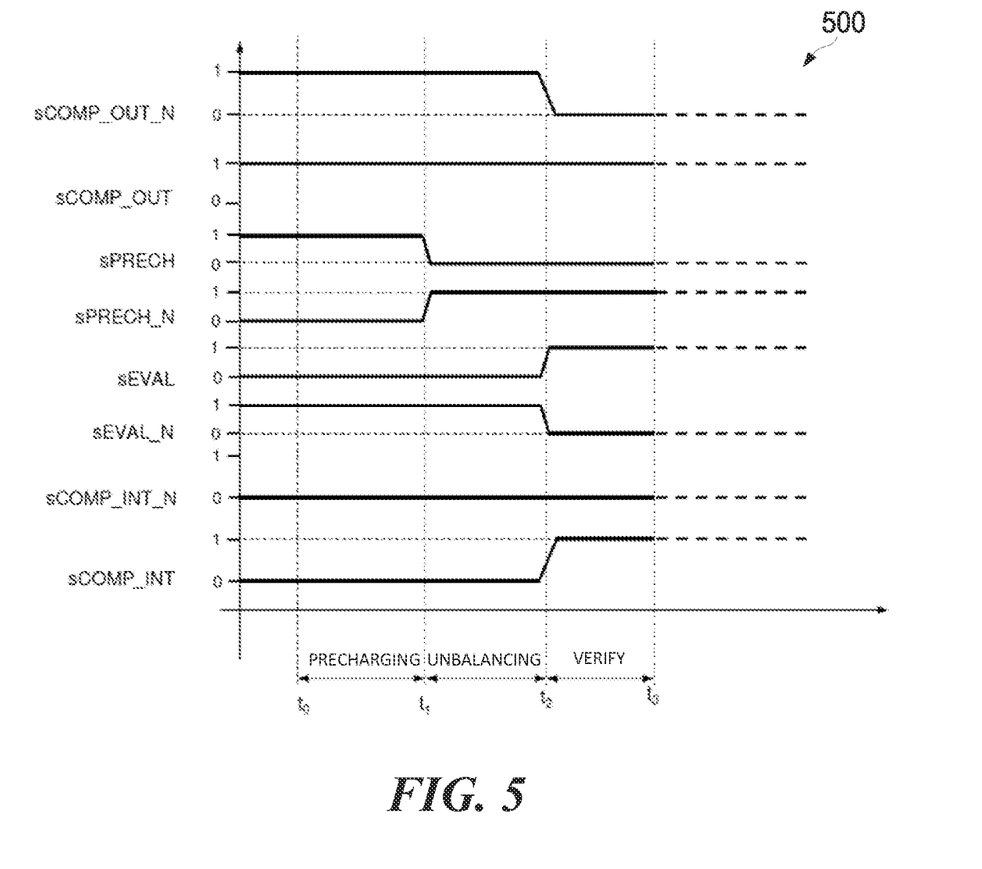
FIG. 5 is an embodiment timing diagram for signals used during a read operation.

FIG. 5 illustrates an embodiment timing diagram 500 for signals sCOMP_OUT_N, sCOMP_OUT, sPRECH, sPRECH_N, sEVAL, sEVAL_N, sCOMP_INT_N, and sCOMP_INT during a read operation.

In embodiments, the first first-level transistor 318a, second second-level transistor 316b, first second-level transistor 316a, and second second-level transistor 316b are in saturation where the bias signals YO and YM are set to a logical value equal to '1'. For example, the bias signals YO and YM are in the range between 1.2 and 1.4 V, which is higher than the supply voltage $V_{dd}$ at 1V. A voltage of about 0.6 V is present on the first bit line (LBL1) and second bit line (LBL2).

In embodiments, an enablement signal sWL_SEL is present on the gate terminals of the access elements 108a of first memory cell 104a and second memory cell 104b (i.e., allows selection of the first memory cell 104a and the second memory cell 104b).

The reference voltage $V_{refp\_sa}$ such that when first pre-charge transistor 304a and second pre-charge transistor 304b are inhibited, the first bias transistor 302a and second bias transistor 302b operate in saturation mode. Thus, a bias current $I_{pol}$ passes through each of the first bias transistor 302a and second bias transistor 302b, which varies according to the particular type of reading procedure.

Figure 7:
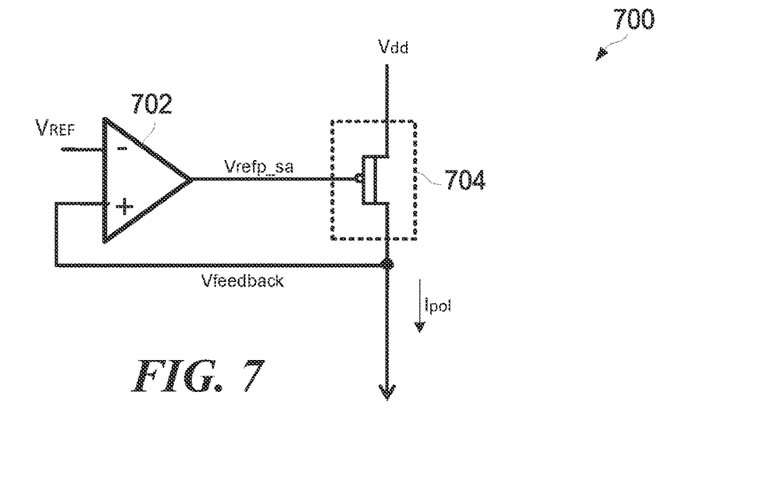
FIG. 7 is an embodiment regulator, as may be implemented in the sense amplifier of FIG. 3.

The reference voltage $V_{refp\_sa}$, first bias transistor 302a, and second bias transistor 302b form current mirrors that can be controlled by, for example, the control logic 106. As detailed herein, the embodiment regulator 700 of FIG. 7 is configured to adjust the value of the bias current $I_{pol}$ to mitigate environmental (e.g., temperature) variations tied to the memory cell behavior.

As shown in FIG. 5, the sense amplifier 300 includes a precharging stage from time $t_0$ to time $t_1$. At time to, signal sEVAL is equal to '0' corresponding to a null voltage, whereas the signal sPRECH has the value '1' corresponding to the supply voltage Va. At the instant time to, the signal sPRECH_N is '0'. Thus, the first pre-charge transistor 304a and second pre-charge transistor 304b operate in the linear region. The current passing through the first pre-charge transistor 304a and second pre-charge transistor 304b is equal to a pre-charge current $I_{PRECH}$, typically around 100 µA.

Further, the first bias transistor 302a and the second bias transistor 302b operate in the linear region. Thus, the bias current $I_{pol}$, which is less than the pre-charge current $I_{PRECH}$, passes through each of the first bias transistor 302a and second bias transistor 302b.

A current $I_{i1}$ equal to the sum of the bias current $I_{pol}$ and pre-charge current $I_{PRECH}$, from the first bias transistor 302a and the first pre-charge transistor 304a flows to the first input node SA<0>.

Likewise, a current $I_{i2}$ equal to the sum of the bias current $I_{pol}$ and pre-charge current $I_{PRECH}$, from the second bias transistor 302b and the second pre-charge transistor 304b, flows to the second input node SA<1>.

Further, at time $t_0$, the first upper control transistor 306a, second upper control transistor 306b, first lower control transistor 308a, and second lower control transistor 308b are inhibited.

Thus, from time $t_0$ to time $t_1$, a current that flows into the first MBL equal to the sum of the bias current $I_{pol}$ and pre-charge current $I_{PRECH}$. As a result, the capacitance 320a formed by the first main bit line (MBL$_1$) is charged during a transient of negligible duration.

Likewise, from time $t_0$ to time $t_1$, a current that flows into the second memory cell 104b, designated with $I_{cell2}$, equal to the sum of the bias current $I_{pol}$ and pre-charge current $I_{PRECH}$. And, the capacitance 320b formed by the second main bit line (MBL$_2$) is charged during the transient of negligible duration.

The currents $I_{cell1}$ and $I_{cell2}$ that flow, respectively, in the first memory cell 104a and the second memory cells 104b depend upon the values of resistance of the storage elements 108a, and therefore upon the data stored.

In addition, at the instant to, the signal sEVAL_N is equal to '1' and signal sEVAL is equal to '0.' Thus, the first verify transistor 312a and the second verify transistor 312b operate in the linear region. Consequently, the shared node between drain terminals of the first sense transistor 310a, first verify transistor 312a, first lower control transistor 308a, and the gate terminal of the second sense transistor 310b is forced to ground. Likewise, the shared node between drain terminals of the second sense transistor 310b, second verify transistor 312b, second lower control transistor 308b, and the gate terminal of the first sense transistor 310a is forced to ground. Thus, the signals sCOMP_INT and s_COMP_INT_N are equal to '0.' As a result, the first sense transistor 310a and second sense transistor 310b are OFF between time $t_0$ and time $t_1$.

Because the signals sCOMP_INT and sCOMP_INT_N are equal to '0,' the first output transistor 406a and second output transistor 406b of the intermediate circuit 400 are inhibited between time $t_0$ and time $t_1$. Further, as the signal sEVAL is equal to '0,' the first enable transistor 404a and the second enable transistor 404b are above the threshold, which forces the logic values of signals sCOMP_OUT and sCOMP_OUT_N to be '1.' Thus, the first cross-coupled transistor 402a and the second cross-coupled transistor 402b are below the threshold.

The sense amplifier 300 includes an unbalancing stage from time $t_1$ to time $t_2$. At time $t_1$, at the end of the pre-charging stage, the logic value of signals sPRECH and sPRECH_N switch to, respectively, '0' and '1.' Thus, at time $t_1$, the first pre-charge transistor 304a and the second pre-charge transistor 304b switch OFF. As a result, the pre-charge current $I_{prech}$ is no longer flowing through the first pre-charge transistor 304a and second pre-charge transistor 304b.

During time $t_1$ to time $t_2$, the signal sEVAL_N remains equal to '1' and signal sEVAL remains equal to '0.' Thus, the shared node between drain terminals of the first sense transistor 310a, first verify transistor 312a, first lower control transistor 308a, and the gate terminal of the second sense transistor 310b remains at ground. Likewise, the shared node between drain terminals of the second sense transistor 310b, second verify transistor 312b, second lower control transistor 308b, and the gate terminal of the first sense transistor 310a remains at ground. The signals sCOMP_INT and s_COMP_INT_N remain equal to '0' and signals sCOMP_OUT and sCOMP_OUT_N remain equal to '1.'

Because the signal sPRECH turns to '0' at instant time $t_1$, the first upper control transistor 306a and the second upper control transistor 306b switch ON and being operating in linear mode. Further, the first lower control transistor 308a and the second lower control transistor 308b switch ON and being operating in saturation mode.

At time t1, a current designated as $I_{branch1}$ flows in the first upper control transistor 306a. The value of the current $I_{branch1}$ is equal to the bias current $I_{pol}$ minus the current $I_{cell1}$, flowing in the first memory cell 104a. Likewise, a current designated as $I_{branch2}$ flows in the second upper control transistor 306b. The value of the current $I_{branch2}$ is equal to the bias current $I_{pol}$ minus the current $I_{cell2}$ flowing in the second memory cell 104b.

In an exemplary embodiment, where the first memory cell 104a is in SET state and the second memory cell 104b is in RESET state, $I_{cell1}$ is greater than $I_{cell2}$. In this exemplary embodiment, $I_{branch1}$ is less than $I_{branch2}$—FIG. 5 is a representative timing diagram of such an exemplary embodiment.

During the unbalancing stage, the current $I_{branch1}$ is flowing through the first upper control transistor 306a and first lower control transistor 308a, which is different from the current $I_{branch2}$ flowing through the second upper control transistor 306b and second lower control transistor 308b. Thus, the branches of sense amplifier 300 are unbalanced. Since from time $t_1$ to time $t_2$ the signal sEVAL_N and sEVAL are kept at, respectively, '1' and '0'; the signals sCOMP_INT and s_COMP_INT_N are still forced to ground.

Finally, the sense amplifier 300 includes the verify stage from time $t_2$ to time $t_3$. Time $t_3$ indicates an ending of the verify stage.

At instant time $t_2$, and at the start of the verify stage, the signal sEVAL_N and sEVAL switch to, respectively, '0' and '1.' Thus, at time $t_2$, the first verify transistor 312a and the second verify transistor 312b switch OFF—no longer forcing signals sCOMP_INT_N and sCOMP_INT to ground.

As currents $I_{branch1}$ and $I_{branch2}$ flow through, respectively, the first lower control transistor 308a and second lower control transistor 308b, the voltage at the drain node of each of the first lower control transistor 308a and second lower control transistor 308b increase from time $t_2$ to time $t_3$.

In the exemplary embodiment of FIG. 5, where the first memory cell 104a is in SET state and the second memory cell 104b is in RESET state and $I_{branch2}$ is greater than $I_{branch1}$, the voltage at the drain node of the second lower control transistor 308b increases more rapidly than the voltage at the drain node of the first lower control transistor 308a.

As detailed previously, the drain node of the second lower control transistor 308b is electrically coupled to the gate of the first sense transistor 310a, and the drain node of the first lower control transistor 308a is electrically coupled to the gate of the second sense transistor 310b. Thus, the gate of a transistor having the faster rise time forces the other transistor to being OFF. In the exemplary embodiment where the first memory cell 104a is in SET state and the second memory cell 104b is in RESET state, the first sense transistor 310a is turned ON and the second sense transistor 310b is turned OFF in the sense state. As a result, slightly after time $t_2$, the signal sCOMP_INT switches to '1,' while sCOMP_INT_N remains at '0.'

Alternatively, in an exemplary embodiment where the first memory cell 104a is in RESET state and the second memory cell 104b is in SET state, slightly after time $t_2$, the signal sCOMP_INT remains at '0,' while sCOMP_INT_N switches to '1.'

Thus, signals sCOMP_INT and sCOMP_INT_N, as complementary logic values, provide a corresponding high or low value as a function of the datum stored in the differential memory cell pairing of the first memory cell 104a and second memory cell 104b.

The first upper control transistor 306a, first lower control transistor 308a, second upper control transistor 306b, and second lower control transistor allow current $I_{branch1}$ and $I_{branch2}$ to remain substantially constant during the verify stage, improving the sensitivity of the sense amplifier 300.

The signals sCOMP_INT_N and sCOMP_INT are passed as inputs to the intermediate circuit 400. Thus, in the sense state where one of the signals sCOMP_INT_N and sCOMP_INT is high and the other is low, the output of the intermediate circuit 400 (i.e., sCOMP_OUT_N and sCOMP_OUT) changes from equal logic values (e.g., '1' '1') to complementary logic values (e.g., '1' '0').

In the exemplary embodiment where the first memory cell 104a is in SET state and the second memory cell 104b is in RESET state, signal sCOMP_INT switches to '1,' while sCOMP_INT_N remains at '0.' Thus, the first output transistor 406a switches ON, which forces the first output node $N_{OUT1}$ to ground. As a result, the signal sCOMP_OUT_N is changed from '1' to '0.' The second output transistor 406b remains inhibited, and the signal sCOMP_OUT remains at '1.'

Further, as the signal sEVAL switches from logic '0' to logic '1' at time $t_2$, the first enable transistor 404a and the second enable transistor 404b drop below the threshold. The first cross-coupled transistor 402a remains inhibited because the gate terminal of the first cross-coupled transistor 402a remains at '1.' The second cross-coupled transistor 402b switches ON and operates in saturation mode because the gate terminal of the second cross-coupled transistor 402b switches to '0.'

Thus, at the instant time t2, the signals sCOMP_INT and sCOMP_INT_N change from the precharging state of '0' and '0' to the sensed state (e.g., '1' and '0,' respectively), which changes the output signals sCOMP_OUT and sCOMP_OUT_N from the '1' and '1' stage to, for example, '1' and '0' state.

Signals sCOMP_OUT and sCOMP_OUT_N have dynamics that substantially extend over the entire range [0-$V_{dd}$], unlike the signals sCOMP_INT and sCOMP_INT_N, the dynamics of which are more limited, on account of the voltage drop that occurs between the source and drain terminals of the first bias transistor 302a and the second bias transistor 302b.

Figure 6:
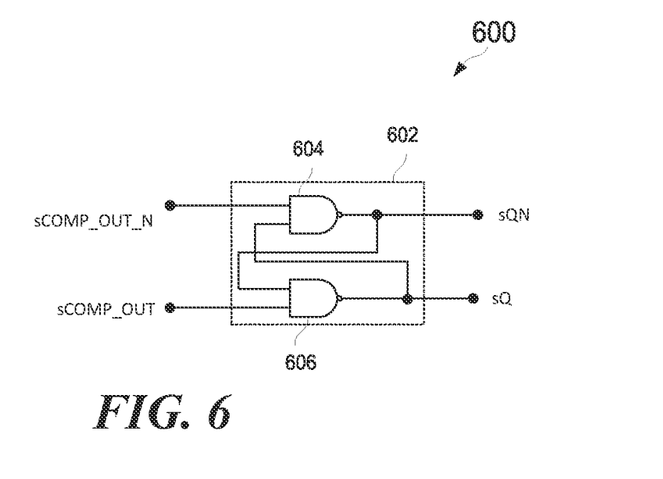
FIG. 6 is an embodiment latch circuit of a sense amplifier.

FIG. 6 illustrates an embodiment latch circuit 600 of the sense amplifier 300. The latch circuit 600 includes a first NAND gate 604 and a second NAND gate 606. The signal sCOMP_OUT_N is coupled to the input of the first NAND gate 604, and the signal sCOMP_OUT is coupled to the input of the second NAND gate 606. As discussed previously, the signals sCOMP_OUT_N and sCOMP_OUT are electrically coupled to, respectively, the first output node $N_{out1}$ and second output node $N_{OUT2}$ of the intermediate circuit 400. Optionally (not shown), latch circuit 600 may include an input sRESET, which is coupled to an output of the control logic 106 to receive the sRESET signal. Latch circuit 600 includes a pair of outputs, at the output of the first NAND gate 604 and the second NAND gate 606, which generate complementary signals sQN and sQ.

The output signals sQ and sQN are equal to '1' and '0,' respectively, when the signals sCOMP_OUT and sCOMP_OUT_N are equal to '1' and '0' during the verify stage. The output signals sQ and sQN keep their state during the pre-charging stage.

Embodiments of this disclosure accommodate the operation of a sense amplifier having a large temperature range, for example, from about −40 degrees Celcius (oC) to about +175° C. In embodiments, this disclosure provides for an increased variation range of the polarization current ($I_{pol}$) of the sense amplifier.

Although, this disclosure provides exemplary regulators that can be used with respect to a sense amplifier as disclosed herein, it should be readily appreciated that these exemplary regulators may be used in combination with other sense amplifiers to similarly provide for an increased variation range of current, such as a polarization current that is variable with temperature.

FIG. 7 illustrates an embodiment regulator 700, as may be implemented in the sense amplifier 300. Regulator 700 includes a common operational amplifier (op-amp) 702 arranged in a voltage follower circuit configuration to provide a voltage controlled current source.

The first input (i.e., inverting input) of the op-amp 702 is connected to a reference voltage ($V_{REF}$). The second input (i.e., non-inverting input) of the op-amp 702 is connected to the drain terminal of transistor 704 having a voltage $V_{feedback}$. In reference to FIG. 3, the transistor 704 represents the first bias transistor 302a or second bias transistor 302b.

The output of the op-amp 702 is connected to the gate terminal of transistor 704, which has a regulated voltage $V_{repf\_sa}$. In embodiments, with respect to FIG. 3, the output of the op-amp 702 is connected to the gate terminals of the first bias transistor 302a, second bias transistor 302b, first lower control transistor 308a, and second lower control transistor 308b. The source terminal of transistor 704 is coupled to the supply voltage $V_{dd}$.

The regulator 700 is configured to adjust the value of the bias current $I_{pol}$ generated by the first bias transistor 302a and the second bias transistor 302b to mitigate and account for environmental (e.g., temperature) variations in the memory cells.

As previously noted, sensing which of the first memory cell 104a or second memory cell 104b is in the SET or RESET state depends on the values of the currents $I_{branch1}$ and $I_{branch2}$. During the verify stage the sense amplifier is configured in single ended mode, and it evaluates the difference between a respective cell current $I_{cell}$ and a reference current—here, current $I_{ref}$.

In particular memory types, such as in phase-change memory (PCM), the temperature has an impact on the current value of the cell current $I_{cell}$ in the few microseconds after the write pulse (i.e., during the verify operation).

Because the difference in current between the two branches of sense amplifier 300 is in the microamp range, to maintain an accurate reading of the memory cells, it is desirable to discriminate this difference in a controlled current window in all temperature ranges.

In embodiments, regulator 700—in the sense amplifier 300 used to read differential-type memory cells—is regulated with respect to the maximum value of the current $I_{cell}$ of the least conductive memory cell of the pair of differential memory cells. The least conductive memory cell between the first memory cell 104a and the second memory cell 104b is the memory cell that is in RESET state. Thus, regulator 700 regulates the voltage $V_{repf\_sa}$ such that $I_{pol}$ is equal to the sum of $I_{cell\_RESET\_max}$ and 10 µA ($I_{pol}=I_{cell\_RESET\_max}+10$ µA), where $I_{cell\_RESET\_max}$ is the maximum value of current $I_{cell}$ in the memory cell being in the RESET state. It should be appreciated that the fixed current value of 10 µA is non-limiting, and in embodiments, the value of the fixed current value may be less than or greater than 10 µA. In some embodiments, the value of the fixed current value is between (and including) 5 and 80 microamps.

Thus, the value of the voltage $V_{REF}$ at the inverting input of op-amp 702 is set to provide a voltage $V_{repf\_sa}$, which in turn provides a current $I_{pol}$ equal to $I_{cell\_RESET\_max}+10$ µA.

Advantageously, the regulator 700 provides a speedy solution without compromising the sensing accuracy by the sense amplifier 300.

In embodiments, the finite state machine circuit 120, the control logic 106, or a controller 1102 of the device 1100 incorporating the non-volatile memory storage device 100 varies the value of the reference voltage ($V_{REF}$) of the op-amp 702 based on a list provided in memory. The list or table provides a reference voltage ($V_{REF}$) for each kind of operation and for each temperature range. This second information can be provided by an external temperature sensor. In such an embodiment, the list or table of corresponding reference voltage ($V_{REF}$) values are stored in on-board memory 122, a memory of a device incorporating the non-volatile memory storage device 100, for example, the random-access memory 1108 described with respect to FIG. 12, or inside a dedicated sector of the PCM itself.

Figure 8:
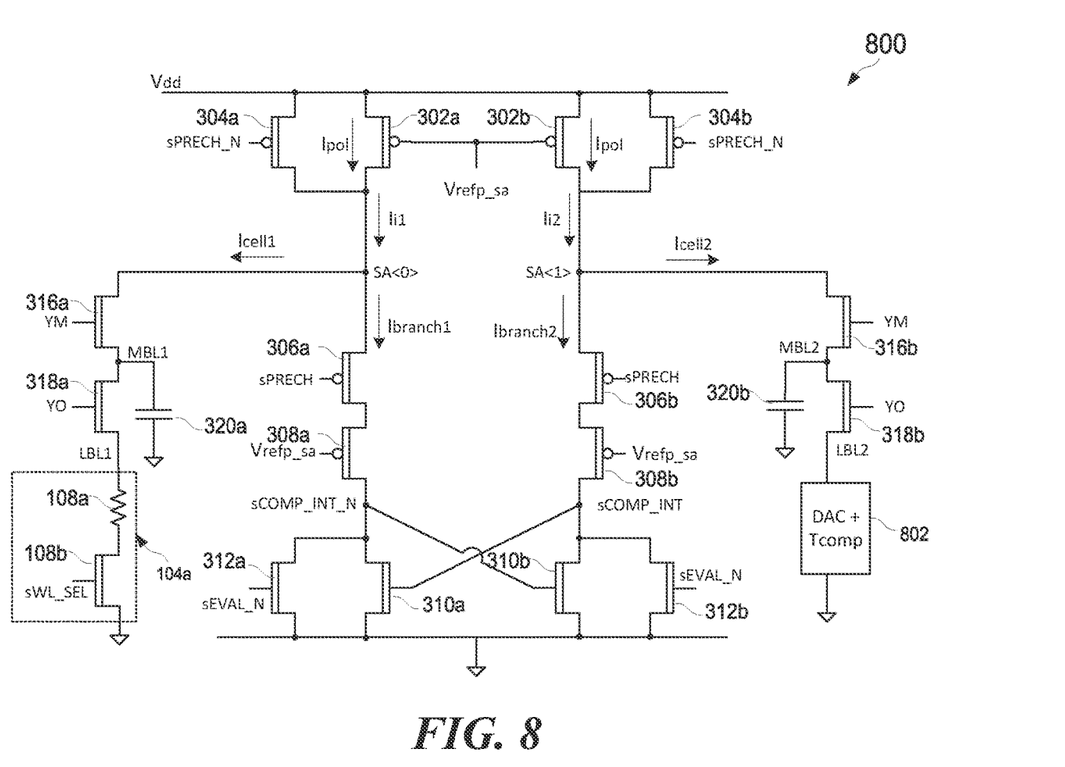
FIG. 8 is an embodiment sense amplifier for reading single-ended type memory cells.

FIG. 8 illustrates an embodiment sense amplifier 800 for reading single-ended type memory cells, as may be implemented in the non-volatile memory storage device 100. In the sense amplifier 800, the first branch is electrically coupled to the first memory cell 104a. In contrast to the sense amplifier 300, sense amplifier 800 does not have a second memory cell 104b in the second branch. In embodiments, the voltage $V_{dd}$ is approximately 1 V, and the voltage at the bit line is about 0.6 V.

In sense amplifier 800, the source terminal of the second first-level transistor 318b is electrically coupled to a current sink circuit 802, instead of the second memory cell 104b in sense amplifier 300. The current sink circuit 802 generates a reference current $I_{DAC}$ by a digital-to-analog converter (DAC). The reference current $I_{DAC}$ plays a similar role to that of the current $I_{cell2}$ in the second branch of sense amplifier 300.

Comparable to sense amplifier 300, in sense amplifier 800, sensing whether first memory cell 104a is in the SET or RESET state depends on the values of the currents $I_{branch1}$ and $I_{branch2}$. During the verify stage, the current $I_{branch1}$ is equal to the difference between $I_{pol}$ and $I_{cell1}$, and the current $I_{branch2}$ is equal to the difference between $I_{pol}$ and $I_{DAC}$. Thus, during the verify stage, the sense amplifier 800 evaluates a difference between the cell current $I_{cell1}$ and current $I_{pol}$ in the first branch with the difference between $I_{DAC}$ and $I_{pol}$ in the second branch.

Figure 9:
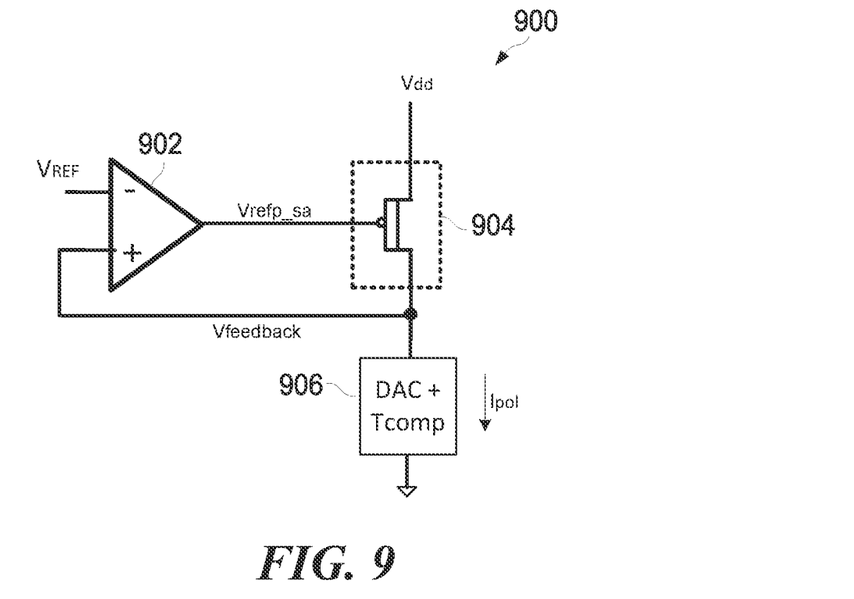
FIG. 9 is an embodiment regulator, as may be implemented in combination with a plurality of sense amplifiers, among which an example is presented in FIG. 8.

FIG. 9 illustrates an embodiment regulator 900, as may be implemented in the sense amplifier 800. Regulator 900 includes a common operational amplifier (op-amp) 902 and the current sink 906.

The first input (i.e., inverting input) of the op-amp 902 is connected to a reference voltage ($V_{REF}$). The second input (i.e., non-inverting input) of the op-amp 902 is electrically coupled to the drain terminal of transistor 904 having a voltage $V_{feedback}$. The second input of the op-am 902 is, additionally, electrically coupled to the current sink 906. Additional information related to the current sink 906 is provided in reference to FIG. 11. In reference to FIG. 8, transistor 904 represents the first bias transistor 302a or second bias transistor 302b. The output of the op-amp 902 is connected to the gate terminal of transistor 904, which has a regulated voltage $V_{repf\_sa}$. In embodiments, with respect to FIG. 8, the output of the op-amp 902 is connected to the gate terminals of the first bias transistor 302a, second bias transistor 302b, first lower control transistor 308a, and second lower control transistor 308b. The source terminal of transistor 904 is coupled to the supply voltage $V_{dd}$.

The regulator 900 is configured to adjust the value of the bias current $I_{pol}$ based on the reference current $I_{ref}$ in the reference branch of the sense amplifier 800. Thus, regulator 900 regulates the voltage $V_{repf\_sa}$ based on the current value of the reference current $I_{ref}$ used in the reference branch (i.e., second branch) of sense amplifier 800. Specifically, the regulator 900 regulates the voltage $V_{repf\_sa}$ such that $I_{pol}$ is equal to $I_{ref}+10$ µA ($I_{pol}=I_{ref}+10$ µA). As a result, during the verify stage, the sense amplifier 800 becomes independent of the reference current $I_{ref}$ by maintaining $I_{branch2}=I_{pol}-I_{ref}=10$ µA. The temperature dependent contribution current ($I_{temp}$) is taken into account inside $I_{ref}$ generation (i.e., $I_{ref}=I_{DAC}+I_{temp}$) and it is configured according to the external temperature sensor code and the look up table in the digital controller. Thus, the reference current $I_{ref}$ and the current $I_{pol}$ are aligned to the behaviour of the memory cell across temperatures, and the accuracy of the sensing becomes independent of the reference current $I_{DAC}$. It should be appreciated that the fixed current value of 10 µA is non-limiting, and in embodiments, the value of the fixed current value may be less than or greater than 10 µA. In some embodiments, the value of the fixed current value is between (and including) 5 and 80 microamps. In embodiments, the value of the temperature dependent contribution current ($I_{temp}$) is between (and including) 1 to 25 microamps.

Figure 10:
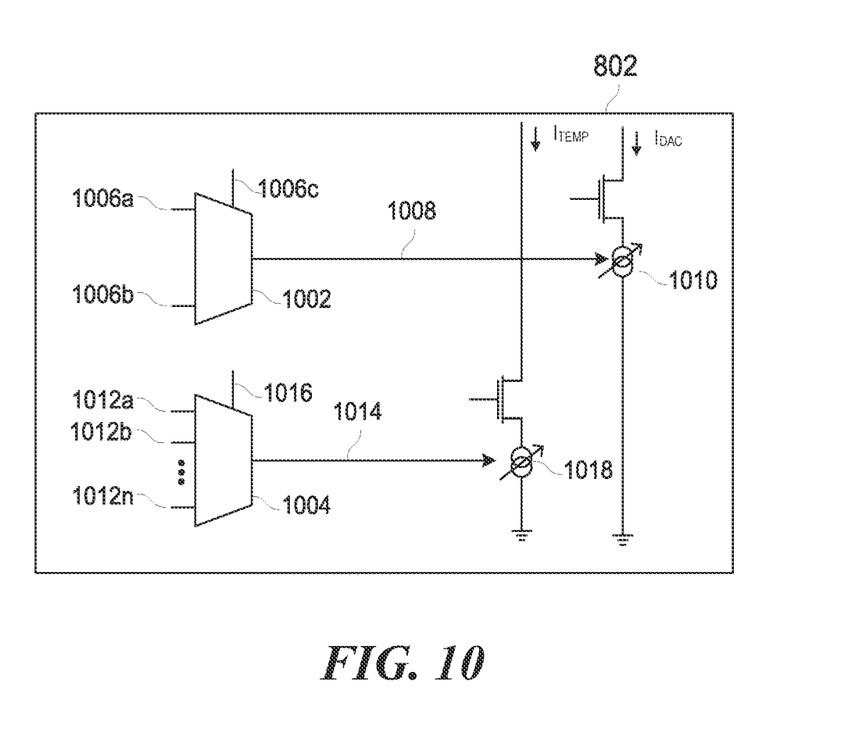
FIG. 10 is an embodiment current sink circuit, as may be implemented in the sense amplifier of FIG. 8.

FIG. 10 illustrates an embodiment current sink circuit 802, as may be implemented in the sense amplifier 800. The current sink circuit 802 includes a first multiplexer 1002 and a second multiplexer 1004.

The first multiplexer 1002 includes inputs 1006a-c and output 1008. The output 1008 is coupled to a first configurable current sink 1010 to generate the current $I_{DAC}$. The inputs 1006a-b correspond to one of SET or RESET verify conditions of the reference current $I_{DAC}$ used in the second branch of the sense amplifier 800. The input 1006c corresponds to a selection between one of the SET or RESET conditions, which may be performed by the finite state machine circuit 120, the control logic 106, or a controller 1102 of the device 1100 incorporating the non-volatile memory storage device 100. During the memory program a sequence of SET program pulses and RESET program pulses is performed through the finite state machine 120. Moreover each program pulse is followed by a verify operation configured according to the kind of pulse that was applied. Once the first multiplexer 1002 receives a signal at the input 1006c, a control signal corresponding to one of the SET or RESET conditions are provided to an input of the first configurable current sink 1010 to generate the current $I_{DAC}$.

The second multiplexer 1004 includes inputs 1012a-n, input 1016, and output 1014. The output 1014 is coupled to a second configurable current sink 1018 to generate the temperature dependent contribution current $I_{TEMP}$. The inputs 1012a-n correspond to N number of temperature configurations stored, for example, in on-board memory 122 or a memory of a device incorporating the non-volatile memory storage device 100, for example, the random-access memory 1108 described with respect to FIG. 12. The second multiplexer 1004 receives a temperature setting signal at input 1016 based on a sensed temperature of the memory cell or non-volatile memory storage device 100. In embodiments, the finite state machine circuit 120 provides the temperature setting signal at input 1016. In some embodiments, the control logic 106 provides the temperature setting signal at input 1016. In other embodiments, a controller 1102 of the device 1100 incorporating the non-volatile memory storage device 100 provides the temperature setting signal at input 1016—see FIG. 12.

The multiplexer selects between the various control signals at inputs 1012a-n to appropriately set the second configurable current sink 1018 based on the temperature setting signal received at input 1016. As a result, the second configurable current sink 1018 generates a corresponding current value for $I_{TEMP}$ based on the sensed temperature. In embodiments, the value of the temperature dependent contribution current ($I_{temp}$) is between (and including) 1 to 25 microamps.

Figure 11:
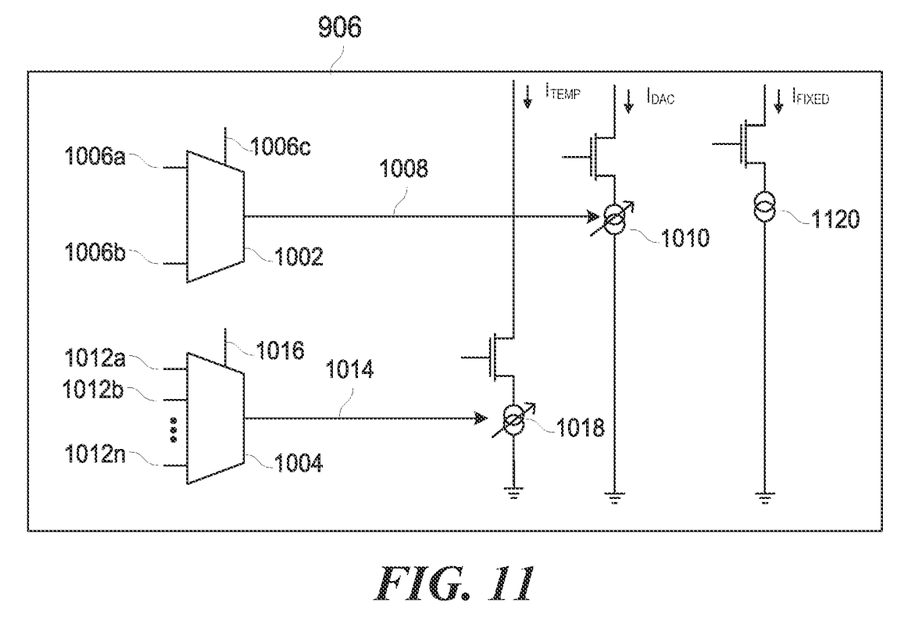
FIG. 11 is an embodiment current sink circuit, as may be implemented in the regulator of FIG. 9.

FIG. 11 illustrates an embodiment current sink circuit 906, as may be implemented in the regulator 900. The current sink 906 is similar to the current sink 802. In addition, however, current sink 906 includes a fixed current sink 1120 to generate the fixed current $I_{FIXED}$. In embodiments, the current value of the fixed current $I_{FIXED}$ is equal to 10 μA. However, this value is non-limiting and currents greater than or less than 10 μA are also contemplated. In some embodiments, the value of the fixed current value is between (and including) 5 and 80 microamps.

The current sunk through first configurable current sink 1010, second configurable current sink 1018, and fixed current sink 1120 acts as a current sunk through, for example, a shunt resistor in a voltage controlled current source configuration. Thus, by adjusting the current values $I_{DAC}$, $I_{TEMP}$, and $I_{FIXED}$, the current sink circuit 906 produces a drop in voltage and the non-inverting input of the op-amp 902 correspondingly adjusts the voltage $V_{repf\_sa}$, given $V_{REF}$.

The current sink circuit 906 in the regulator 900 and the current sink 802 in the sense amplifier 800 act in unison such that the correspondingly generated $I_{DAC}$ and $I_{TEMP}$ values are equal in value.

Figure 12:
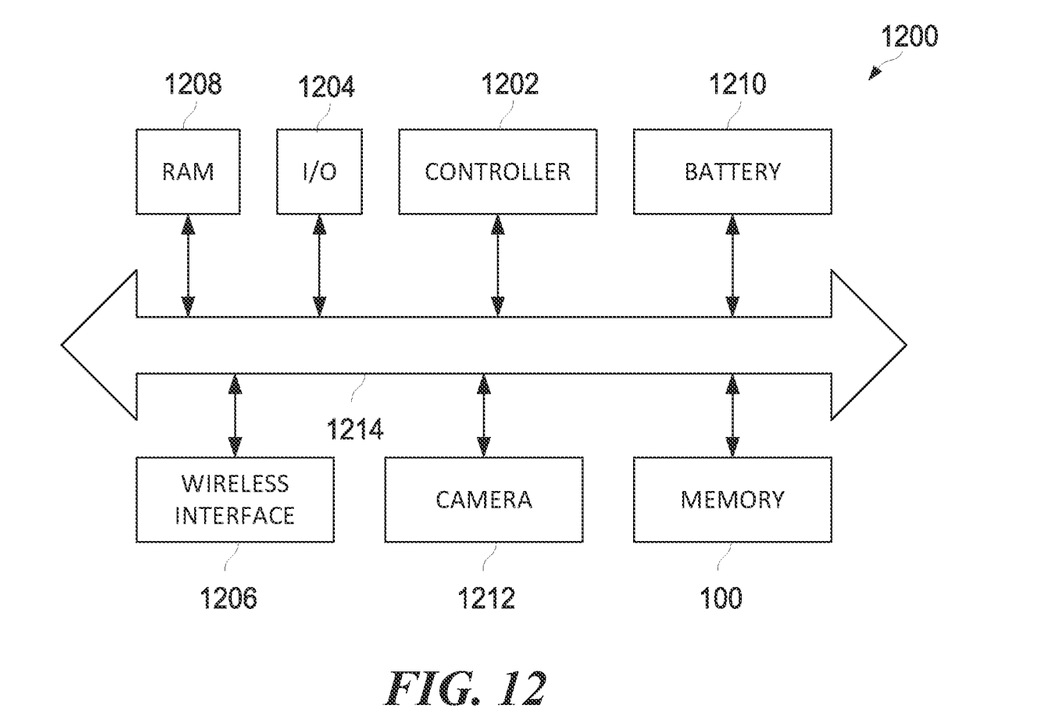
FIG. 12 is an electronic device 1100 incorporating the non-volatile memory storage device of FIG. 1.

FIG. 12 illustrates an electronic device 1200 incorporating the non-volatile memory storage device 10a. The electronic device 1200 may be, for example, a personal digital assistant (PDA), a portable or desktop computer, possibly with the capacity of wireless data transfer, a mobile phone, a digital audio player, a camera or a camcorder, or the like, capable of processing, storing, transmitting, and receiving information.

The electronic device 1200 includes the controller 1202 (e.g., a microcontroller, microprocessor, processor, or the like), an interface 1204 (e.g., keyboard, display, or the like) to input and display data, the non-volatile memory storage device 100, a wireless interface 1206 (e.g., antenna, or the like) for transmitting and receiving data through a radiofrequency wireless communication network, random-access memory (RAM) 1208, a battery 1210 used to supply power to the electronic device 1200, and optional camera 1212. The various components of the electronic device 1200 are coupled through a bus 1214. The controller 1202 can control the non-volatile memory storage device 100 by, for example, co-operating with the control logic 106.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

It is understood that the embodiments of this disclosure are not limited to applications disclosed herein regarding the measurement of a voltage drop at a reserve capacitor in a supplemental restraint system. The various embodiments are also applicable to other applications that benefit from measuring a voltage drop at a terminal of an electronic circuit having an unknown baseline voltage.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A non-volatile memory storage device, comprising:
an array of memory cells of a differential type, the array of memory cells comprising a plurality of pair of memory cells, each pair of memory cells having a first memory cell and a second memory cell, the first memory cell being in one of a SET state or a RESET state and the second memory cell being in a state other than that of the first memory cell;
a sense amplifier comprising a first branch coupled to a first memory cell and a second branch coupled to a second memory cell, the sense amplifier configured to:
generate a first bias current in the first branch by a first transistor of the sense amplifier,
generate a second bias current in the second branch by a second transistor of the sense amplifier, the first bias current being the same as the second bias current, sense a first delta current corresponding to a difference between the first bias current and a current flowing in the first memory cell, and sense a second delta current corresponding to a difference between the second bias current and a current flowing in the second memory cell; and a regulator coupled to the sense amplifier, the regulator configured to generate a regulated voltage to gate terminals of the first transistor and the second transistor of the sense amplifier, the regulated voltage generated such that the first bias current and the second bias current have a current value equal to the sum of a maximum current flowing in a memory cell being in a RESET state and a fixed current.

2. The non-volatile memory storage device of claim 1, wherein a value of the fixed current is between 5 and 80 microamps.

3. The non-volatile memory storage device of claim 1, wherein source terminals of the first transistor and the second transistor are coupled to a supply voltage having a voltage of approximately 1 Volts.

4. The non-volatile memory storage device of claim 1, wherein the regulator comprises an operational amplifier (op-amp) having a non-inverting input coupled to a drain terminal of the first transistor and an inverting input coupled to a reference voltage.

5. The non-volatile memory storage device of claim 1, wherein the first memory cell is in a SET state and the second memory cell is in the RESET state, and the current flowing in the first memory cell being greater than the current flowing in the second memory cell.

6. The non-volatile memory storage device of claim 1, wherein the first memory cell is in a SET state and the second memory cell is in the RESET state, and the second memory cell being a lesser conductive memory cell than the first memory cell.

7. The non-volatile memory storage device of claim 1, further comprising a memory used to store a list of reference voltage values corresponding to each particular pair of memory cells of the array of memory cells, and the regulated voltage is generated such that the current value being equal to the sum of the maximum current flowing in the memory cell being in the RESET state is particular to each memory cell pairing of the array of memory cells.

8. A non-volatile memory storage device, comprising:
an array of memory cells of a single-ended type, each memory cell being in one of a SET state or a RESET state;
a sense amplifier comprising a first branch coupled to a memory cell and a second branch coupled to a reference current source, the sense amplifier configured to:
generate a first bias current in the first branch by a first transistor of the sense amplifier,
generate a second bias current in the second branch by a second transistor of the sense amplifier, the first bias current being the same as the second bias current,
sense a first delta current corresponding to a difference between the first bias current and a current flowing in the memory cell, and
sense a second delta current corresponding to a difference between the second bias current and a reference current generated by the reference current source; and
a regulator coupled to the sense amplifier, the regulator configured to generate a regulated voltage to gate terminals of the first transistor and the second transistor of the sense amplifier, the regulated voltage generated such that the first bias current and the second bias current have a current value equal to the sum of a fixed current and the reference current generated by the reference current source across temperature.

9. The non-volatile memory storage device of claim 8, wherein a value of the fixed current is between 5 and 80 microamps.

10. The non-volatile memory storage device of claim 8, wherein source terminals of the first transistor and the second transistor are coupled to a supply voltage having a voltage of approximately 1 Volts.

11. The non-volatile memory storage device of claim 8, wherein the regulator comprises an operational amplifier (op-amp) having a non-inverting input and an inverting input, the non-inverting input coupled to a drain terminal of the first transistor and the reference current source, and the inverting input coupled to a reference voltage.

12. The non-volatile memory storage device of claim 8, wherein the reference current source comprises a digital-to-analog circuit, the reference current source being generated by the digital-to-analog circuit, and the reference current is adjusted based on a temperature reading of the non-volatile memory storage device.

13. The non-volatile memory storage device of claim 8, wherein the regulator comprises an operational amplifier (op-amp) having a non-inverting input coupled to a drain terminal of the first transistor, the non-inverting input further coupled in a shunt configuration with the reference current source.

14. The non-volatile memory storage device of claim 13, wherein the reference current source comprises a multiplexer and a configurable current sink, the multiplexer configured to adjust the configurable current sink based on a sensed temperature of the non-volatile memory storage device.

15. A device, comprising:
an array of memory cells of a single-ended type, each memory cell being in one of a SET state or a RESET state;
a sense amplifier comprising a first branch coupled to a memory cell and a second branch coupled to a reference current source, the sense amplifier configured to:
generate a first bias current in the first branch by a first transistor of the sense amplifier,
generate a second bias current in the second branch by a second transistor of the sense amplifier, the first bias current being the same as the second bias current,
sense first delta current corresponding to a difference between the first bias current and a current flowing in the memory cell, and
sense a second delta current corresponding to a difference between the second bias current and a reference current generated by the reference current source;
a regulator coupled to the sense amplifier, the regulator configured to generate a regulated voltage to gate terminals of the first transistor and the second transistor of the sense amplifier, the regulated voltage generated such that the first bias current and the second bias current have a current value equal to the sum of a fixed current and the reference current generated by the reference current across temperature; and
a controller coupled to the regulator, sense amplifier, and the array of memory cells, the controller configured to generate a control signal to the regulator to generate the regulated voltage.

16. The device of claim 15, wherein a value of the fixed current is between 5 and 80 microamps.

17. The device of claim 15, wherein source terminals of the first transistor and the second transistor are coupled to a supply voltage having a voltage of approximately 1 Volts.

18. The device of claim 15, wherein the regulator comprises an operational amplifier (op-amp) having a non-inverting input coupled to a drain terminal of the first transistor, the non-inverting input further coupled in a shunt configuration with the reference current source.

19. The device of claim 18, wherein the reference current source comprises a multiplexer and a configurable current sink, the multiplexer configured to adjust the configurable current sink based on a sensed temperature of the array of memory cells.

20. The device of claim 15, wherein the reference current generated by the reference current source is adjusted based on a temperature reading of the array of memory cells, and wherein the reference current is adjusted based on temperature between 1 and 25 microamps.

* * * * *